US011009554B2

(12) United States Patent
Nakagawa et al.

(10) Patent No.: US 11,009,554 B2
(45) Date of Patent: May 18, 2021

(54) SENSOR MODULE AND RESIDUAL BATTERY CAPACITY MONITORING METHOD USING SENSOR MODULE

(71) Applicant: ALPS ALPINE CO., LTD., Tokyo (JP)

(72) Inventors: Masashi Nakagawa, Miyagi (JP); Touichi Okuno, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 375 days.

(21) Appl. No.: 16/174,790

(22) Filed: Oct. 30, 2018

(65) Prior Publication Data

US 2019/0064281 A1 Feb. 28, 2019

Related U.S. Application Data

(63) Continuation of application No. PCT/JP2017/008365, filed on Mar. 2, 2017.

(30) Foreign Application Priority Data

Jun. 24, 2016 (JP) .............................. JP2016-125396

(51) Int. Cl.
*G01R 31/36* (2020.01)
*G01R 31/389* (2019.01)
(Continued)

(52) U.S. Cl.
CPC .......... *G01R 31/389* (2019.01); *G01R 31/36* (2013.01); *G01R 31/3648* (2013.01);
(Continued)

(58) Field of Classification Search
CPC ..... G01R 31/36; G01R 31/389; G01R 31/371
See application file for complete search history.

(56) References Cited

U.S. PATENT DOCUMENTS 4,803,417 A * 2/1989 Nowakowski ..... G01R 31/3648
320/136
6,025,699 A * 2/2000 Cummings ............... H02J 7/00
320/136
(Continued)

FOREIGN PATENT DOCUMENTS

JP      H06-281708      10/1994
JP      2000-134705      5/2000
(Continued)

OTHER PUBLICATIONS

International Search Report dated Apr. 18, 2017 in PCT/JP2017/008365 filed on Mar. 2, 2017.

*Primary Examiner* — Walter L Lindsay, Jr.
*Assistant Examiner* — Milton Gonzalez
(74) *Attorney, Agent, or Firm* — IPUSA, PLLC

(57) ABSTRACT

A sensor module includes a sensor, a wireless communication unit notifying a measurement value obtained by the sensor and a value based on the measurement value, a battery supplying a voltage to an electric circuit including the sensor and the wireless communication unit, a voltage measurement unit measuring an end-to-end voltage of the battery at a predetermined measurement interval, and a measurement interval change unit changing the measurement interval of the voltage measurement unit, wherein the measurement interval change unit sets, if the end-to-end voltage measured by the voltage measurement unit is equal to or greater than a first specified voltage value, the measurement interval to a first time interval, and the measurement interval change unit sets, if the end-to-end voltage measured by the voltage measurement unit is lower than the first specified voltage value, the measurement interval to a second time interval shorter than the first time interval.

8 Claims, 7 Drawing Sheets

(51) Int. Cl.
*H02J 7/00* (2006.01)
*H01M 10/42* (2006.01)
*G01R 31/371* (2019.01)
*H01M 10/48* (2006.01)

(52) U.S. Cl.
CPC .......... *G01R 31/371* (2019.01); *H01M 10/42* (2013.01); *H01M 10/488* (2013.01); *H02J 7/00* (2013.01); *H02J 7/0047* (2013.01); *H02J 7/0048* (2020.01)

(56) References Cited

U.S. PATENT DOCUMENTS

| | | | |
|---|---|---|---|
| 6,037,778 A * | 3/2000 | Makhija ............. | G01R 31/3648 324/433 |
| 6,459,896 B1 * | 10/2002 | Liebenow ......... | H04M 1/72519 455/423 |
| 7,688,032 B2 | 3/2010 | Kamishima et al. | |
| 2012/0049802 A1 | 3/2012 | Barsukov et al. | |

FOREIGN PATENT DOCUMENTS

| | | |
|---|---|---|
| JP | 2000-261547 | 9/2000 |
| JP | 2010-038775 | 2/2010 |
| JP | 2012-108139 | 6/2012 |
| JP | 2012-161151 | 8/2012 |
| JP | 2013-541700 | 11/2013 |

\* cited by examiner

SENSOR MODULE AND RESIDUAL BATTERY CAPACITY MONITORING METHOD USING SENSOR MODULE

CROSS-REFERENCE TO RELATED APPLICATION

This application is a continuation of and claims the benefit under 35 U.S.C. § 120 and § 365 (c) of PCT International Patent Application No. PCT/JP2017/008365 filed on Mar. 2, 2017 and designating the U.S., which claims the priority to Japanese Patent Application No. 2016-125396 filed on Jun. 24, 2016. The entire content of the foregoing applications are incorporated herein by reference.

BACKGROUND OF THE INVENTION

1. Field of the Invention

The present invention relates to a sensor module and a residual battery capacity monitoring method using the sensor module.

2. Description of the Related Art

Conventionally, a method for estimating a residual battery capacity of a secondary battery installed in a vehicle is known as disclosed in Patent Document 1. Patent Document 1 discloses a method of estimating a residual battery capacity by accumulating a charge discharge current of battery or by accumulating charge discharge power of battery, correcting, in a case where a first condition is satisfied, a residual battery capacity using a first correction value, and correcting, in a case where a second condition whose satisfaction frequency is higher than the first condition is satisfied, the residual battery capacity using a second correction value whose accuracy is lower than that of the first correction value.

[Patent Document 1] Japanese Unexamined Patent Application Publication No. 2012-108139

[Patent Document 2] Japanese Unexamined Patent Application Publication No. 2000-134705

SUMMARY OF THE INVENTION

In recent years, a sensor module driven by a battery has a function of reporting a battery replacement to a user. In this sensor module, it is sufficient to know a timing of replacing the battery, and it is unnecessary to constantly monitor the residual battery capacity like a secondary battery installed in the vehicle. Because substantial electric power is consumed to estimate the residual battery capacity, useless power is consumed by the conventional method of constantly monitoring the residual battery capacity to make the battery replacement timing earlier.

The present invention is provided in consideration of this situation. An object of the present invention is to provide a sensor module enabling to suppress power consumption for monitoring a residual battery capacity and a residual battery capacity monitoring method for monitoring the residual battery capacity.

There is provided a sensor module including a sensor, a notification unit configured to notify a measurement value obtained by the sensor and a value based on the measurement value, a battery configured to supply a voltage to an electric circuit including the sensor and the notification unit, a voltage measurement unit configured to measure an end-to-end voltage of the battery at a predetermined measurement interval, and a measurement interval change unit configured to change the measurement interval of the voltage measurement unit, wherein the measurement interval change unit sets, in a case where the end-to-end voltage of the battery measured by the voltage measurement unit is equal to or higher than a first specified voltage value which is previously set, the measurement interval to a first time interval, and wherein the measurement interval change unit sets, in a case where the end-to-end voltage of the battery measured by the voltage measurement unit is lower than the first specified voltage value, the measurement interval to a second time interval which is shorter than the first time interval.

DETAILED DESCRIPTION OF THE PREFERRED EMBODIMENTS

A description is given below, with reference to the FIG. 1 through FIG. 8 of embodiments of the present invention. Where the same reference symbols are attached to the same parts, repeated description of the parts is omitted.

Reference symbols typically designate as follows:
1: sensor module;
2: battery;
3: electric circuit;
4: resistor (load);
5: switch;
11: sensor;
12: wireless communication unit (notification unit);
13: voltage measurement unit;
15: control unit;
21: switch control unit;
22: measurement interval change unit;
23: timer;
24: residual battery capacity estimation unit;
31: calculation unit;
32: memory unit;
33: estimation unit;
34: difference operation unit; and
35: acquisition unit.

The sensor module of the embodiment and its residual battery capacity monitoring method are described below referring to figures.

Figure 1:
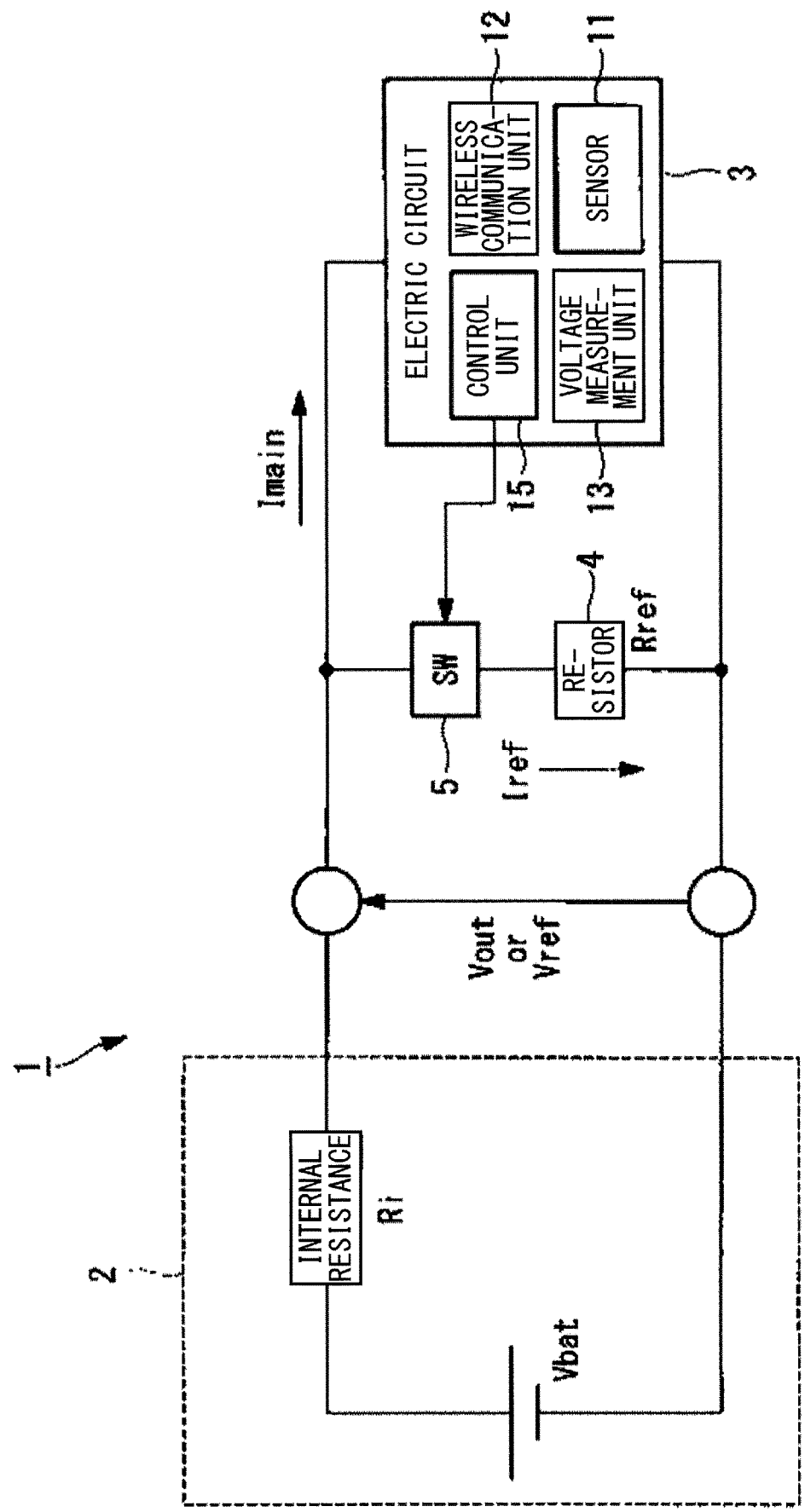
FIG. 1 illustrates a schematic structure of a sensor module according to an embodiment of the present invention.

FIG. 1 illustrates a schematic structure of the sensor module according to an embodiment of the present invention. Referring to FIG. 1, the sensor module 1 includes a battery 2, an electric circuit 3, a register (load) 4 that is connected in parallel with the battery 2 and has a known resistor value, and a switch 5 connected with the resistor 4 in series. The battery 2 is, for example, a primary battery. The electric circuit 3 includes a sensor 11, a wireless communication unit (notification unit) 12, a voltage measurement unit 13, and a control unit 15. An example of the sensor 11 is a pressure sensor, a magnetic sensor, a temperature sensor, a humidity sensor, a gyro sensor, a UV/illuminance sensor, and so on. The sensor 11 may be formed by a single sensor or multiple sensors. The wireless communication unit 12 sends a measurement value obtained by the sensor 11 or a value based on the measurement value (for example, a value from which a noise is reduced) to an outside, for example, a host computer provided outside. The wireless communication unit 12 sends the residual battery capacity or a battery replacement timing estimated by a residual battery capacity estimation unit 24 described below. In place of the wireless communication unit 12, for example, a communication unit sending information by wired communication, a display unit integrally provided with the sensor module 1, a speaker notifying the user of the information in an auditory way using voice or the like.

The voltage measurement unit 13 measures the end-to-end voltage of the battery 2 at a predetermined measurement interval. Specifically, the voltage measurement unit 13 measures the end-to-end voltage Vout in a case were the switch 5 is opened. The voltage measurement unit 13 measures the end-to-end voltage Vref of the battery subjected to a voltage drop due to an internal resistance Ri, which is equivalent to the resistance of the battery 2, in a case were the switch 5 is closed. Hereinafter, in order to distinguish the end-to-end voltage Vout from the end-to-end voltage Vref, the end-to-end voltage Vout in the case where the switch 5 is opened is referred to as an open circuit voltage Vout.

As described above, the sensor module 1 of the embodiment is a sensor module formed by integrating the sensor 11 and the wireless communication unit 12. The sensor module 1 functions as an IoT device in the Internet of things (IoT).

The control unit 15 is, for example, a microcomputer, or a micro controller unit, and includes a CPU, a read only memory (ROM) storing a program executed by a CPU, a random access memory (RAM) functioning as a work area at a time of executing the programs, and so on. ROM stores various programs (for example, a residual battery capacity monitoring program). Various functions described later are substantialized when CPU reads the program from ROM to RAM and executes the program.

Figure 2:
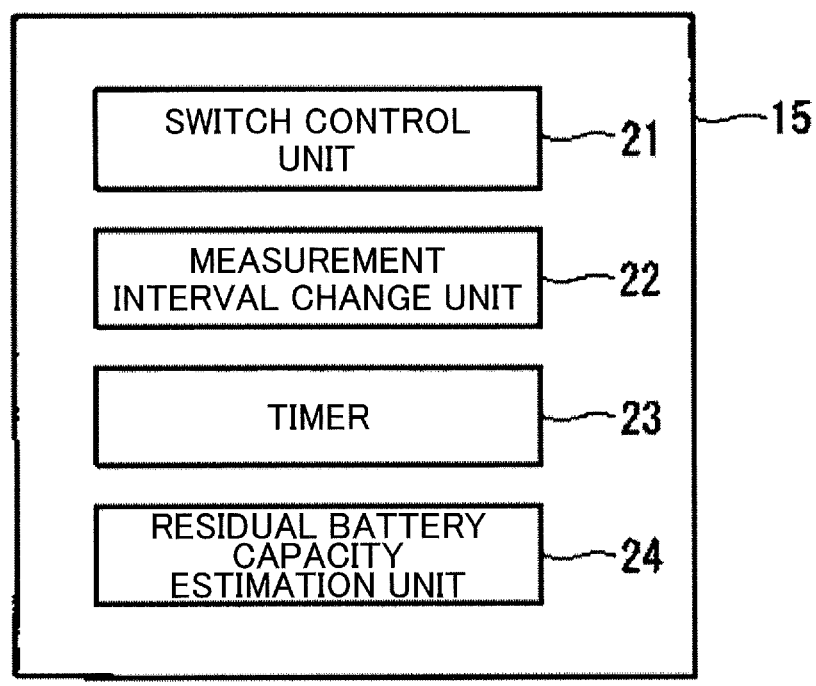
FIG. 2 is a functional block diagram expanding functions performed by a control unit of the embodiment of the present invention.

FIG. 2 is a functional block diagram, in which functions of the control units 15 are divided. As illustrated in FIG. 2, the control unit 15 includes a switch control unit 21, a measurement interval change unit 22, a timer 23, and a residual battery capacity estimation unit 24.

The switch control unit 21 controls opening and closing the switch 5.

Figure 3:
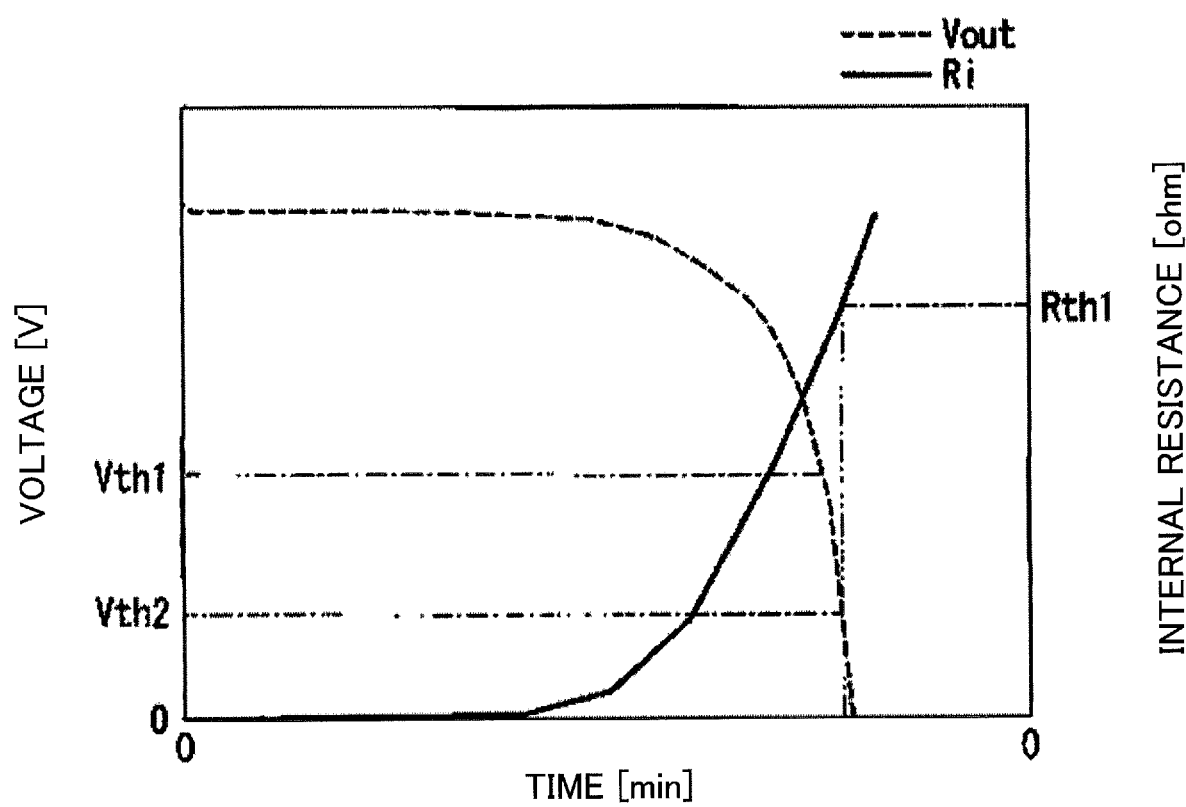
FIG. 3 illustrates aging variations of an open circuit voltage and an internal resistance value of a battery and a voltage specified value.

The measurement interval change unit 22 changes a measurement interval used by the voltage measurement unit 13. Referring to FIG. 3, the open circuit voltage Vout of the battery has a tendency of decreasing at an accelerated rate when the operation life of the battery 2 approaches its expiry, and the internal resistance Ri of the battery has a tendency of increasing at the accelerated rate when the operation life of the battery 2 approaches its expiry. Within this embodiment, a first specified voltage value Vth1 and a second specified voltage value Vth2 are set based on this tendency, and the voltage measurement interval is shortened in a stepwise manner.

More specifically, the first specified voltage value Vth1 is set to a voltage range before the tendency of decreasing the voltage begins to be conspicuous. The second specified voltage value Vth2 is set to a voltage range in which the residual battery capacity begins to decrease at an accelerated rate. For example, the first specified voltage value Vth1 is set to be a residual battery capacity equal to or greater than about 30% and equal to or smaller than about 60%. The second specified voltage value Vth2 is set to be a residual battery capacity equal to or greater than about 10% and equal to or smaller than about 30%.

The measurement interval change unit 22 sets the first time interval (for example, 24 hours) as an initial value of the measurement interval of the voltage measurement, said differently, in a case where the open circuit voltage Vout of the battery is equal to or greater than the first specified voltage value Vth1. The measurement interval change unit 22 changes the measurement interval to the second time interval (for example, 10 hours) in a case where the open circuit voltage Vout of the battery is smaller than the first specified voltage value Vth1. Further, the measurement interval change unit 22 changes the measurement interval to the third time interval (for example, 1 hour) in a case where the open circuit voltage Vout of the battery is smaller than the second specified voltage value Vth2.

With this, it is possible to suppress the power consumption by reducing the frequency of the voltage measurement in a state where the battery 2 is substantially in a fully charged state, and it is possible to accurately know the battery replacement timing by increasing the measurement frequency of the battery from a time when the residual battery capacity begins to be reduced at an accelerated rate.

Within the embodiment, the measurement interval is changed based on not only the open circuit voltage Vout of the battery but also the internal resistance Ri of the battery. For example, referring to FIG. 3, the first resistor specified value Rth corresponding to the second specified voltage value Vth2 is set. In a case where the internal resistance Ri of the battery is equal to or greater than the first resistor specified value Rth1, the measurement interval of the voltage is changed to the third time interval (for example, one hour).

Within the embodiment, the case where the time interval of battery measurement is changed to 3 stages is exemplified. However, the stages of the time interval are not limited thereto. For example, the change of the time interval for measuring the battery may be limited to one time, or the time interval may be finely changed to three or more stages using multiple voltage specified values. Further, the resistor specified value may not be used, or the time interval may be changed using two or more resistor specified values.

The timer 23 measures a time (the measurement interval) set up by the measurement interval change unit 22 and causes a trigger to be generated every time when the setup time elapses.

The residual battery capacity estimation unit 24 operates the residual battery capacity in a case where the open circuit voltage Vout of the battery measured by the voltage measurement unit 13 is lower than the first specified voltage value Vth1. The residual battery capacity estimation unit 24 operates the internal resistance Ri of the battery using the voltage measurement unit 13 using the open circuit voltage Vout and the end-to-end voltage Vref that are measured by the internal resistance Ri, and estimates the residual battery capacity using this internal resistance Ri.

Figure 4:
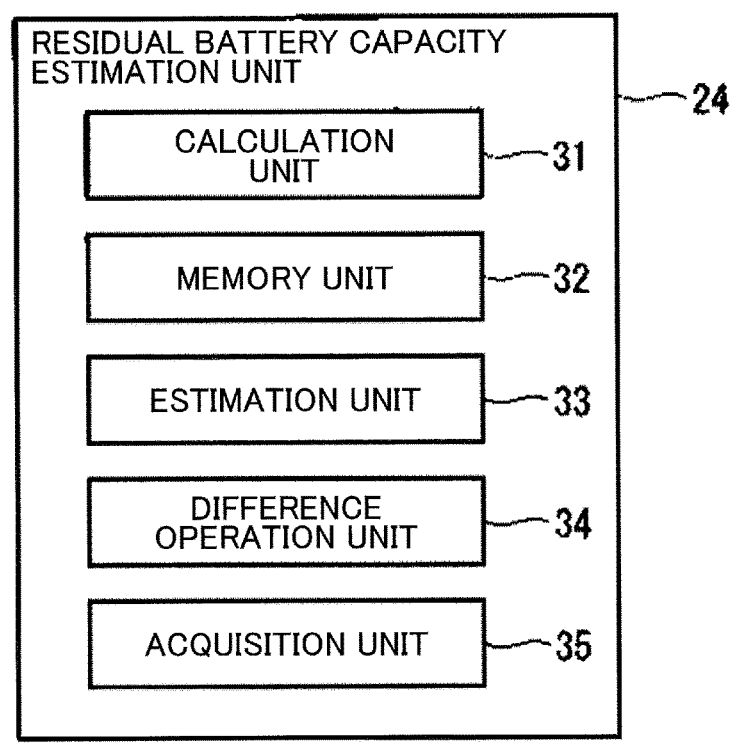
FIG. 4 is a functional block diagram illustrating a function performed by the residual battery capacity estimation unit illustrated in FIG. 2.

For example, the residual battery capacity estimation unit 24 includes a calculation unit 31, a memory unit 32, an estimation unit 33, a difference operation unit 34, and an acquisition unit 35, as illustrated in FIG. 4.

The calculation unit 31 calculates the internal resistance Ri of the battery using the following Expression (1).

$$Ri=(Vout/Vref-1)Rref \quad [\text{Expression (1)}]$$

In Expression (1), Rref is the resistor value of the resistor 4 and is previously known.

For example, an electric current Imain flowing through the electric circuit 3 can be made small by stopping operations of the wireless communication unit 12 and the sensor 11 that are included in the electric circuit 3. At this time, the electric current Imain is very small in comparison with the electric current Iref flowing through the resistor 4 so as to be regarded as zero. Then, the following Expression (2) is satisfied in a case where the switch 5 is in a closed state. Then, the following Expression (3) is satisfied in a case where the switch 5 is in an opened state.

$$Vbat=Ri \times Iref+Vref=Ri \times Iref+Rref \times Iref \quad [\text{Expression (2)}]$$

$$Vbat=Vout \quad [\text{Expression (3)}]$$

In Expressions (2) and (3), Vbat represents an end-to-end voltage of the battery which is not affected by the internal resistance Ri. The Expression (1) is obtained from the above Expressions (2) and (3).

Figure 5:
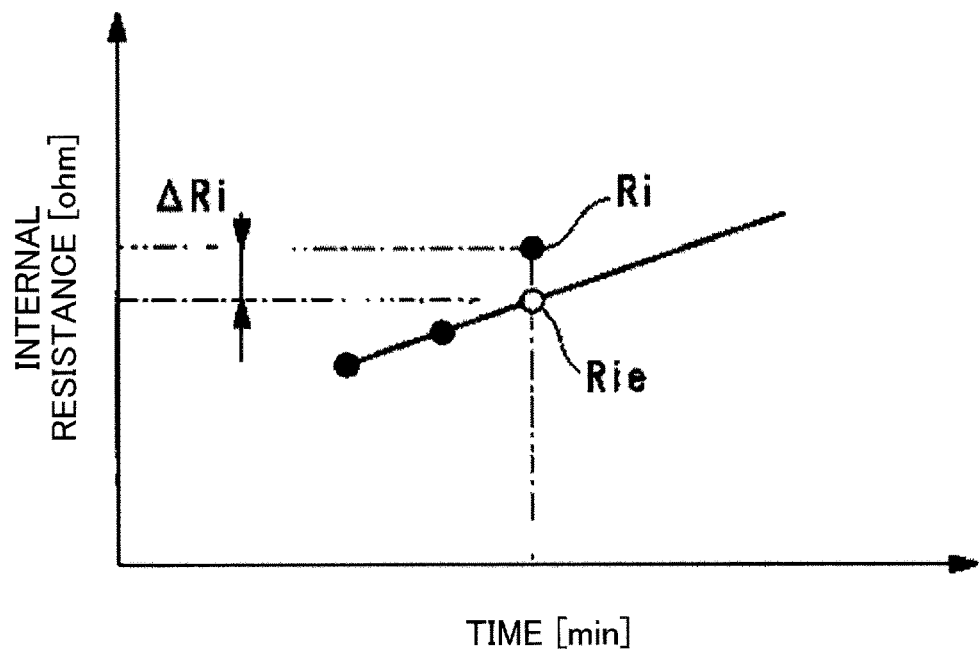
FIG. 5 illustrates a calculation content of a difference operation unit illustrated in FIG. 2.

The memory unit 32 stores the internal resistance Ri calculated by the calculation unit 31. The estimation unit 33 estimates a current internal resistance Rie of the battery using a past internal resistance Ri of the battery calculated by the calculation unit 31, namely the internal resistance Ri stored in the memory unit 32. For example, as illustrated in FIG. 5, the estimation unit 33 operates an approximate line using a previous value and a further previous value of the internal resistance Ri, and estimates the current internal resistance Rie from the approximate line. The difference operation unit 34 calculates a difference ΔRi between the newest internal resistance Ri (i.e., the current value) of the battery calculated by the calculation unit 31 and the internal resistance Rie estimated by the estimation unit 33.

Figure 6:
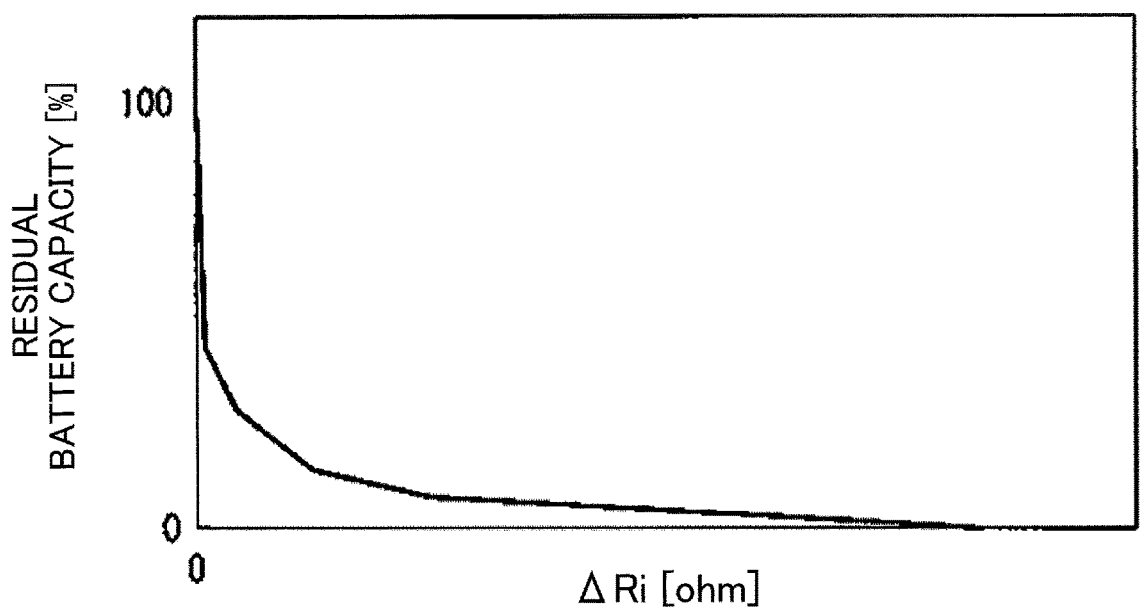
FIG. 6 illustrates an example of residual battery capacity information.

The acquisition unit 35 has residual battery capacity information, in which a difference ΔRi of the internal resistance and a residual battery capacity are associated, and acquires a residual battery capacity corresponding to the difference ΔRi calculated by the difference operation unit 34 using the residual battery capacity. FIG. 6 illustrates an example of residual battery capacity information. Regarding FIG. 5, the horizontal axis represents a difference ΔRi of the internal resistance, and the vertical axis represents the residual battery capacity. The residual battery capacity information may be prepared as a table or an operation expression having the difference ΔRi as a parameter.

As illustrated in FIG. 6, in an area where the residual battery capacity is substantially 100%, the change of the residual battery capacity relative to the change of the difference ΔRi of the internal resistance is extremely high. However, in an area having a residual battery capacity of at most about 40%, said differently, an area sought to enhance an estimation accuracy of the residual battery capacity, the residual battery capacity changes calmly relative to the change of the difference ΔRi of the internal resistance.

Therefore, in the area having the residual battery capacity of at most about 40%, the estimation accuracy of the residual battery capacity can be enhanced using the difference ΔRi of the internal resistance.

Figure 7:
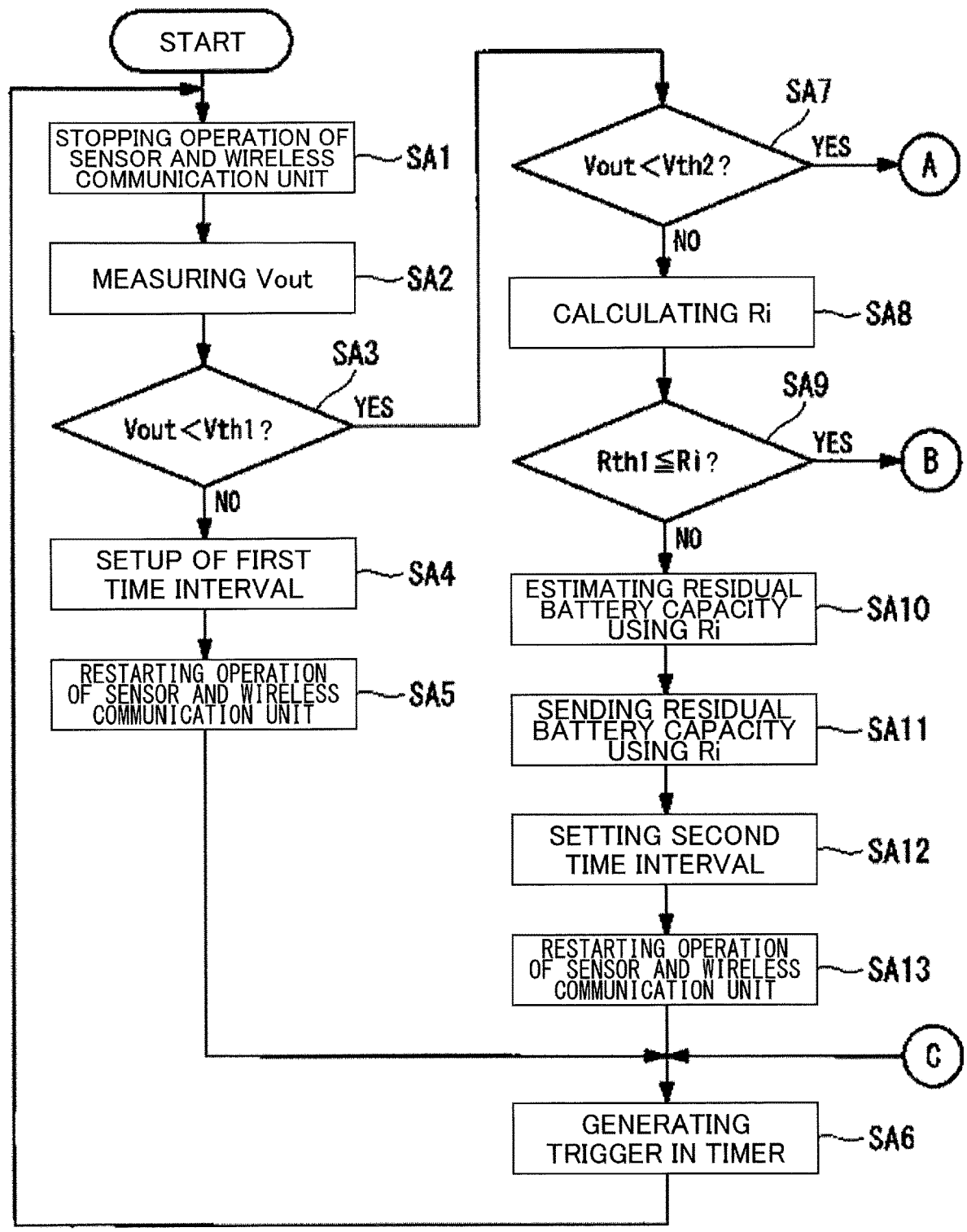
FIG. 7 is a flowchart indicating an example of a processing procedure of the residual battery capacity monitoring method sensor module performed by a sensor module.
Figure 8:
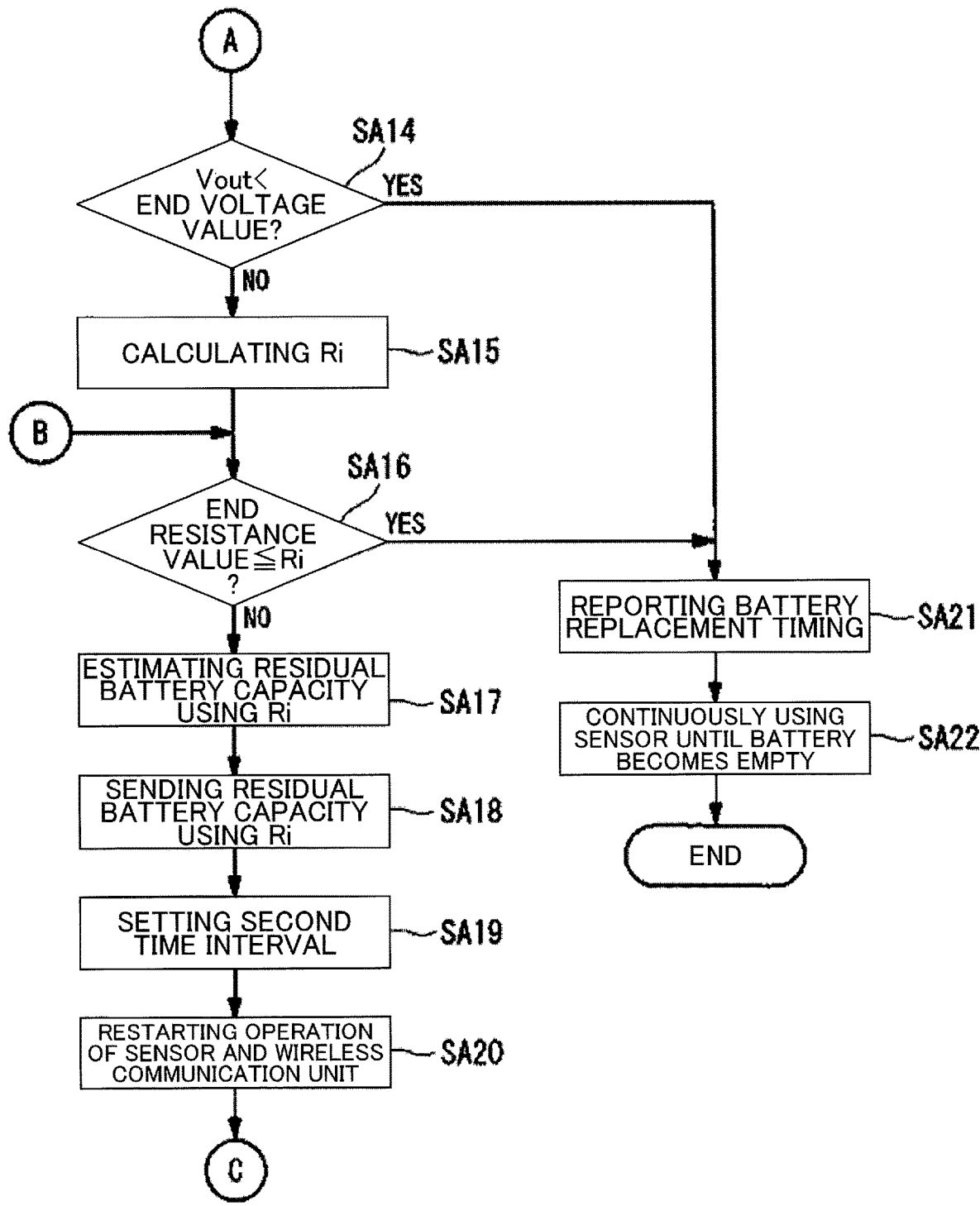
FIG. 8 is a flowchart indicating an example of a processing procedure of the residual battery capacity monitoring method sensor module performed by a sensor module.

Referring to FIGS. 7 and 8, a residual battery capacity monitoring method performed by the above structured sensor module 1 is described. FIGS. 7 and 8 are flowcharts indicating an example of the processing procedure of the residual battery capacity monitoring method for the sensor module of the embodiment of the present invention. The following processes are performed by the control unit 15 included in the electric circuit.

At first, operations of the sensor 11 and the wireless communication unit 12 are stopped to restrict to minimize the electric current Imain flowing through the electric circuit 3 (step SA1). Subsequently, the switch 5 is in a closed state and the open circuit voltage Vout of the battery is measured (step SA2). Next, it is determined whether the open circuit voltage Vout of the battery measured in step SA2 is smaller than the first specified voltage value Vth1 (step SA3). As a result, if the open circuit voltage Vout of the battery is not less than the first specified voltage value Vth1 ("NO" in step SA3), the first time interval (for example, 24 hours) is set as an initial value to the timer 23 (step SA4). Thereafter, operations of the sensor 11 in the stopped state and the wireless communication unit 12 is restarted (step SA5).

Subsequently, after a trigger by the timer 23 is generated in step SA6, the process returns to step SA1, and the processes on or after the step SA1 are performed again.

Next, in a case where the open circuit voltage Vout of the battery is determined to be lower than the first specified voltage value Vth1 ("YES" in step SA3), the process moves to step SA7, and it is determined that the open circuit voltage Vout of the battery is lower than the second specified voltage value th2 that is previously set. As a result, in a case where the open circuit voltage Vout of the battery is not lower than the second specified voltage value Vth2 ("NO" in step SA7), the internal resistance Ri of the battery is calculated (step SA8). Specifically, the switch is in the closed state, and then the end-to-end voltage Vref of the battery is measured. Then, the internal resistance Ri is operated from the above Expression (1) using the end-to-end voltage Vref and the open circuit voltage Vout measured in the step SA2.

Next, it is determined that the internal resistance Ri is equal to or greater than the first resistor specified value Rth1 that is previously set (step SA9). In a case where the internal resistance Ri is smaller than the first resistor specified value Rth1 ("NO" in step SA9), the internal resistance Ri is used to estimate the residual battery capacity by the above described measure (step SA10), and the estimated residual battery capacity is sent through the wireless communication unit 12 to an outside (for example, a host computer) (step SA11).

Subsequently, a second time interval (for example, 10 hours) is set (step SA12). Thereafter, the operations of the sensor 11 and the wireless communication unit 12 in the stopped state is restarted (step SA13).

Subsequently, after a trigger by the timer 23 is generated in step SA6, the process returns to step SA1, and the processes on or after the step SA1 are performed again.

On the other hand, in a case where it is determined that the open circuit voltage Vout of the battery is determined to be lower than a second specified voltage value Vth2 of the open voltage Vout of the battery ("YES" in step SA7) or the internal resistance Ri is determined to be equal to or greater than the first resistor specified value Rth1 ("YES" in step SA9), the process goes to step SA14 in FIG. 8.

In step SA14, it is determined whether the open circuit voltage Vout of the battery is smaller than an end voltage value that is set to be smaller than the second specified voltage value Vth2. Here, the end voltage value is set to be an operation guarantee minimum voltage for the electric circuit 3 or a value with predetermined allowance to the operation guarantee minimum voltage. As a result, in a case where the open circuit voltage Vout of the battery is not lower than the end voltage value ("NO" in step SA14), the internal resistance Ri of the battery is calculated (step SA15). Subsequently, it is determined whether the internal resistance Ri is equal to or greater than the end resistance value that is set smaller than the first resistor specified value Rth1 (step SA16). In a case where the internal resistance Ri is smaller than the end resistance value ("NO" in step SA16), the internal resistance Ri is used to estimate the residual battery capacity by the above described measure (step SA10), and the estimated residual battery capacity is sent through the wireless communication unit 12 to the outside (for example, the host computer) (step SA18). Here, the end resistance value is set to be an estimated internal resistance value corresponding to the end voltage value.

Subsequently, a third time interval (for example, 1 hour) is set to the timer 23 (step SA19). Thereafter, the operations of the sensor 11 and the wireless communication unit 12 in the stopped state is restarted (step SA20).

Subsequently, after a trigger by the timer 23 is generated in step SA6, the process returns to step SA1, and the processes on or after the step SA1 are performed again.

On the other hand, in a case where the open circuit voltage Vout of the battery is determined to be lower than the end voltage value ("YES" in step SA14) or in a case where the internal resistance Ri is determined to be equal to or greater than the end resistance value, the user is notified that a battery exchange is necessary through the wireless communication unit 12 (step SA21). With this, the arrival of a battery replacement timing is notified the user. Subsequently, the operations of the sensor 11 and the wireless communication unit 12 are restarted (step SA22) and continue until the residual battery capacity is consumed or the battery is replaced.

As described above, according to the sensor module 1 and the residual battery capacity monitoring method, in a case where the open circuit voltage Vout of the battery is equal to or higher than the first specified voltage value Vth1, said differently, the residual battery capacity is in a state substantially fully charged, the estimation of residual battery capacity is omitted, and the open circuit voltage Vout of the battery is smaller than first specified voltage value Vth1. After reaching the area in which the residual battery capacity decreases at an accelerated rate, an operation frequency of the residual battery capacity is made high as the residual battery capacity decreases. With this, it is possible to restrict the power consumed due to voltage measurement or measurement of the residual battery capacity can be suppressed in comparison with a case where the voltage measurement or the measurement of the residual battery capacity is continuously performed at a constant cycle length.

Further, because the residual battery capacity is estimated in consideration of the internal resistance Ri, the estimation accuracy of residual battery capacity can be enhanced to enable the user to be more accurately notified of battery replacement timing.

Within this embodiment, the internal resistance Ri is operated using the open circuit voltage Vout of the voltage and the end-to-end voltage Vref of the battery. However, the internal resistance Ri may instead be operated using the open circuit voltage Vout of the voltage and the electric current Iref flowing through the resistor 4. Said differently, the end-to-end voltage Vref and the electric current Iref are in a relation expressed in Expression (4) below. Therefore, the electric current Iref can be used in place of the end-to-end voltage Vref of the battery. In this case, it is necessary to provide a current measurement unit that measures the electric current Ires flowing through the resistor.

$$Vref = Iref \times Rref \qquad \text{[Expression (4)]}$$

Within the embodiment, exemplified is a case where the voltage measurement unit 13 and the control unit 15 are separately provided. For example, the function of the voltage measurement unit 13 and the electric current measurement function may be included in the control unit 15. For example, a microcomputer or the like having the voltage measurement function may be employed as the control unit 15.

Further, within the embodiment, the open circuit voltage Vout of the battery 2 and each voltage specified value are compared to change the voltage measurement interval. However, instead of the open circuit voltage Vout battery 2, the end-to-end voltage Vref of the battery may be employed.

Within the embodiment, the wireless communication unit 12 notifies the outside of the battery replacement. For example, an LED, a display unit, and so on are provided in the sensor module in addition to the wireless communication unit 12, and the LED, the display unit, and so on may be notified the user of the battery replacement.

Within the embodiment, the residual battery capacity estimation unit 24 depicts an approximate curve using a previous value and a further previous value, and the current value of the internal resistance Ri is estimated using the approximate curve. However, the measure of estimating the current value of the internal resistance Ri is not limited thereto. For example, the estimation can be statistically performed by using at least three past values.

The embodiment provides a sensor module including a sensor, a notification unit configured to notify a measurement value obtained by the sensor and a value based on the measurement value, a battery configured to supply a voltage to an electric circuit including the sensor and the notification unit, a voltage measurement unit configured to measure an end-to-end voltage of the battery at a predetermined measurement interval, and a measurement interval change unit configured to change the measurement interval of the voltage measurement unit, wherein the measurement interval change unit sets, in a case where the end-to-end voltage of the battery measured by the voltage measurement unit is equal to or higher than a first specified voltage value which is previously set, the measurement interval to a first time interval, and wherein the measurement interval change unit sets, in a case where the end-to-end voltage of the battery measured by the voltage measurement unit is lower than the first specified voltage value, the measurement interval to a second time interval which is shorter than the first time interval.

According to the embodiment, in a case where the end-to-end voltage of the battery is equal to or higher than the first specified voltage value, the voltage measurement is performed at the first time interval, and in a case where the end-to-end voltage of the battery is lower than the first specified voltage value, the voltage measurement is performed at the second time shorter than the first time interval. With this, during a time period when the residual battery capacity is almost in the fully charged state and the residual battery capacity needs not be estimated, the measurement frequency is relatively lowered to suppress the power consumption. With this, during a time period when the residual battery capacity is relatively small and the residual battery capacity needs to be estimated, the measurement frequency is relatively increased to prevent the estimation accuracy of the residual battery capacity from decreasing.

The above first specified voltage value is set to a voltage range, in which a tendency of decreasing the voltage along with, for example, the decrease of the residual battery capacity. The first specified voltage value is set to the voltage range equal to or greater than about 30% and equal to or smaller than about 60% of the residual battery capacity.

The sensor module may include a load connected to the battery in parallel, a resistor value of the load being already known, a switch connected to the load in series, and a residual battery capacity estimation unit configured to estimate, in a case where the end-to-end voltage of the battery measured by the voltage measurement unit is lower than the first specified voltage value, estimates the residual battery capacity, wherein the residual battery capacity estimation unit calculates an internal resistance using the end-to-end voltage of the battery measured by the voltage measurement unit and estimates the residual battery capacity using the internal resistance of the battery.

According to the structure, in a case where the end-to-end voltage of the battery is equal to or higher than the first specified voltage value, the residual battery capacity estimation unit does not estimate the residual battery capacity. Therefore, the electric power consumption concerning the estimation of the residual battery capacity can further be restricted. Further, because the residual battery capacity is estimated using the internal resistance, the estimation accuracy of the residual battery capacity can further be improved.

For example, the voltage measurement unit measures the end-to-end voltage of the battery when the switch is opened and closed. The residual battery capacity estimation unit may calculate the internal resistance using two measurement values measured by the voltage measurement unit.

Further, the sensor module may further include the current measurement unit for measuring the electric current flowing through the load when the switch is in the closed state. The residual battery capacity estimation unit may calculate, the internal resistance using the electric current using the end-to-end voltage of the battery when the switch is in the opened state and the electric current flowing through the load when the switch is in the closed state.

In the sensor module, the residual battery capacity estimation unit may include a calculation unit configured to calculate the internal resistance, an estimation unit configured to estimate a current internal resistance of the battery using a past internal resistance of the battery calculated by the calculation unit, a difference operation unit configured to calculating a difference between the current internal resistance of the battery calculated by the calculation unit and the current internal resistance of the battery estimated by the estimation unit, and an acquisition unit configured to acquire the residual battery capacity of the battery using the difference operated by the difference operation unit.

According to this structure, besides the internal resistance of the battery is calculated by the calculation unit, the estimation unit estimates the current internal resistance of the battery using the past internal resistance of the battery that was calculated by the calculation unit. Then, the difference operation unit calculates the difference between the current internal resistance of the battery calculated by the calculation unit and the current internal resistance of the battery estimated by the estimation unit, and the residual battery capacity is acquired by the acquisition unit using this difference. As described, by estimating the residual battery capacity based on the change and transition of the internal resistance, the estimation accuracy of the area having a relatively small residual battery capacity can be improved.

In the sensor module, the measurement interval change unit may have at least one of a plurality of voltage specified values related to the battery end-to-end voltage and the internal resistance, and change the measurement interval by the voltage measurement unit as the end-to-end voltage of the battery becomes lower or as the internal resistance becomes greater.

According to this structure, the measurement interval of the voltage measurement unit is stepwise changed so as to be shortened as the residual battery capacity decreases. With this, the electric power consumption concerning the voltage measurement can be minutely managed and suppressed.

In the sensor module, in a case where the end-to-end voltage of the battery is lower than a predetermined end voltage value or the internal resistance of the battery is equal to or higher than a predetermined end resistance value, a battery replacement may be determined to be necessary so that the switch is maintained to be in an open state and a voltage measurement using a voltage measurement unit is stopped.

According to this structure, the electric power consumption concerning the estimation of the residual battery capacity can be made zero when and after the end-to-end voltage of the battery becomes smaller than the end voltage value or the internal resistance of the battery becomes equal to or greater than the preset end resistance value. With this, it is possible to make an operable time of the sensor long in comparison with a case where the residual battery capacity is thoroughly estimated.

The above "end voltage value" is set to be an operation guarantee minimum voltage for the electric circuit 3 or a value with predetermined allowance to the operation guarantee minimum voltage.

The above "end resistance value" is set to be an estimated internal resistance value corresponding to the end voltage value.

In the sensor module, the notification unit may notify a user that the battery replacement is necessary in a case where the end-to-end voltage of the battery is lower than the predetermined end voltage value or the internal resistance of the battery is equal to or higher than the predetermined end resistance value.

Further, the notification unit may notify a residual battery capacity estimated by the residual battery capacity estimation unit.

According to this structure, the user may be notified of an event that the battery replacement is necessary or the residual battery capacity estimated by the residual battery capacity estimation unit. For example, a wireless communication unit sending information by wireless communication may be employed as the notification unit.

The embodiment provides a residual battery capacity monitoring method for monitoring a residual battery capacity of a sensor module that includes a sensor, a notification unit configured to notify a measurement value obtained by the sensor and a value based on the measurement value, a battery configured to supply a voltage to an electric circuit including the sensor and the notification unit, and a voltage measurement unit configured to measure an end-to-end voltage of the battery at a predetermined measurement interval including changing, in a case where the end-to-end voltage of the battery measured by the voltage measurement unit is less than the first specified voltage value, the measurement interval measured by the voltage measurement unit to a second time interval which is shorter than the first time interval, and simultaneously starting an estimation of the residual battery capacity of the battery.

The present invention performs an effect of suppressing power consumption caused to be used for monitoring the residual battery capacity.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority or inferiority of the invention. Although a sensor module has been described in detail, it should be understood that various changes, substitutions, and alterations could be made thereto without departing from the spirit and scope of the invention.

What is claimed is:

1. A sensor module comprising:
   a sensor;
   a notification unit configured to notify a measurement value obtained by the sensor and a value based on the measurement value;
   a battery configured to supply a voltage to an electric circuit including the sensor and the notification unit;
   a load connected to the battery in parallel, a resistance value of the load being already known;
   a switch connected to the load in series;
   a voltage measurement unit configured to measure an end-to-end voltage of the battery at a predetermined measurement interval;
   a measurement interval change unit configured to change the measurement interval of the voltage measurement unit, and
   a residual battery capacity estimation unit configured to estimate, in a case where the end-to-end voltage of the battery measured by the voltage measurement unit is lower than a first specified voltage value which is previously set, estimates a residual battery capacity,
   wherein the measurement interval change unit sets, in a case where the end-to-end voltage of the battery measured by the voltage measurement unit is equal to or higher than the first specified voltage value, the measurement interval to a first time interval,
   wherein the measurement interval change unit sets, in a case where the end-to-end voltage of the battery measured by the voltage measurement unit is lower than the first specified voltage value, the measurement interval to a second time interval which is shorter than the first time interval, and
   wherein the residual battery capacity estimation unit calculates an internal resistance of the battery using the end-to-end voltage of the battery measured by the voltage measurement unit and estimates the residual battery capacity using the internal resistance of the battery.

2. The sensor module according to claim 1,
   wherein the residual battery capacity estimation unit includes
      a calculation unit configured to calculate the internal resistance,
      an estimation unit configured to estimate a current internal resistance of the battery using a past internal resistance of the battery calculated by the calculation unit,
      a difference operation unit configured to calculating a difference between the current internal resistance of the battery calculated by the calculation unit and the current internal resistance of the battery estimated by the estimation unit, and
      an acquisition unit configured to acquire the residual battery capacity of the battery using the difference operated by the difference operation unit.

3. The sensor module according to claim 1,
   wherein the measurement interval change unit
      has at least one of a plurality of voltage specified values related to the battery end-to-end voltage and the internal resistance, and
      changes the measurement interval by the voltage measurement unit as the end-to-end voltage of the battery becomes lower or as the internal resistance becomes greater.

4. The sensor module according to claim 1,
   wherein, in a case where the end-to-end voltage of the battery is lower than a predetermined end voltage value or the internal resistance of the battery is equal to or higher than a predetermined end resistance value, a battery replacement is determined to be necessary so that the switch is maintained to be in an open state and a voltage measurement using a voltage measurement unit is stopped.

5. The sensor module according to claim 1,
   wherein the notification unit notifies a user that the battery replacement is necessary in a case where the end-to-end voltage of the battery is lower than a predetermined end voltage value or the internal resistance of the battery is equal to or higher than the predetermined end resistance value.

6. The sensor module according to claim 1,
   wherein the notification unit notifies the residual battery capacity estimated by the residual battery capacity estimation unit.

7. The sensor module according to claim 1,
   wherein the notification unit is a wireless communication unit sending information by wireless communication.

8. A residual battery capacity monitoring method, for monitoring a residual battery capacity of a sensor module that includes
   a sensor,
   a notification unit configured to notify a measurement value obtained by the sensor and a value based on the measurement value,
   a battery configured to supply a voltage to an electric circuit including the sensor and the notification unit,
   a load connected to the battery in parallel, a resistance value of the load being already known;
   a switch connected to the load in series;
   a voltage measurement unit configured to measure an end-to-end voltage of the battery at a predetermined measurement interval,
   a measurement interval change unit configured to change the measurement interval of the voltage measurement unit, and
   a residual battery capacity estimation unit configured to estimate, in a case where the end-to-end voltage of the battery measured by the voltage measurement unit is lower than a first specified voltage value which is previously set, estimates a residual battery capacity, the residual battery capacity monitoring method comprising:

changing, by the measurement interval change unit, in a case where the end-to-end voltage of the battery measured b the voltage measurement unit is equal to or higher than the first specified voltage value, the measurement interval to a first time interval;

changing, by the measurement interval change unit, in a case where the end-to-end voltage of the battery measured by the voltage measurement unit is lower than the first specified voltage value, the measurement interval to a second time interval which is shorter than the first time interval; and calculating, by the residual battery capacity estimation unit, an internal resistance of the battery using the end-to-end voltage of the battery measured by the voltage measurement unit and estimates the residual battery capacity using the internal resistance of the battery.

* * * * *